(12) United States Patent
Ikehashi et al.

(10) Patent No.: US 7,027,334 B2
(45) Date of Patent: Apr. 11, 2006

(54) SEMICONDUCTOR MEMORY DEVICE

(75) Inventors: Tamio Ikehashi, Yokohama (JP);
Takashi Ohsawa, Yokohama (JP);
Katsuyuki Fujita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 186 days.

(21) Appl. No.: 10/617,046

(22) Filed: Jul. 11, 2003

(65) Prior Publication Data
US 2005/0047240 A1 Mar. 3, 2005

(30) Foreign Application Priority Data
May 9, 2003 (JP) .............................. 2003-132091

(51) Int. Cl.
*G11C 7/00* (2006.01)
(52) U.S. Cl. ................... 365/189.07; 365/207
(58) Field of Classification Search ................ 365/196, 365/207, 189.01, 189.04, 226, 189.07
See application file for complete search history.

(56) References Cited

U.S. PATENT DOCUMENTS 5,519,652 A * 5/1996 Kumakura et al. .... 365/185.21

(Continued)

FOREIGN PATENT DOCUMENTS

| EP | 1 096 501 A1 | 5/2001 |
|----|---|---|
| EP | 1 288 955 A2 | 3/2003 |
| JP | 2-3165 | 1/1990 |

OTHER PUBLICATIONS

T. Ohsawa, et al., ISSCC 2002 / Session 9 / Dram and Ferroelectric Memories 9. 1, pp. 152-153, "Memory Design Using One-Transistor Gain Cell on SOI", 2002.

(Continued)

*Primary Examiner*—Thong Q. Le
(74) *Attorney, Agent, or Firm*—Oblon, Spivak, McClelland, Maier & Neustadt, P.C.

(57) ABSTRACT

A semiconductor memory device includes: a device substrate having a semiconductor layer separated by a dielectric layer from a base substrate; a memory cell array having a plurality of memory cells formed and arranged on the semiconductor layer of the device substrate, each the memory cell having a MOS transistor structure with a body in an electrically floating state to store data based on a majority carrier accumulation state of the body; and a sense amplifier circuit configured to read out data of a selected memory cell in the memory cell array to store the read data in a data latch, then transfer the read data to an output circuit and write back the read data into the selected memory cell.

16 Claims, 12 Drawing Sheets

U.S. PATENT DOCUMENTS

| | | |
|---|---|---|
| 6,205,076 B1 | 3/2001 | Wakayama et al. |
| 6,538,916 B1 | 3/2003 | Ohsawa |
| 6,667,214 B1 * | 12/2003 | Yamada ...................... 438/276 |
| 6,812,519 B1 * | 11/2004 | Furuhata ..................... 257/316 |
| 6,847,088 B1 * | 1/2005 | Yamada ...................... 257/392 |
| 2002/0141252 A1 * | 10/2002 | Takami et al. .............. 365/190 |

OTHER PUBLICATIONS

U.S. Appl. No. 10/617,046, filed Jul. 11, 2003, Ikehashi et al.

U.S. Appl. No. 10/854,403, filed May 14, 2004, Yamada et al.

Pierre C. Fazan et al., "A Simple 1-Transistor Capacitor-Less Memory Cell for High Performance Embedded DRAMs", IEEE 2002 Custom Integrated Circuits Conference, pp. 7-1-1 to 7-1-4.

* cited by examiner

SEMICONDUCTOR MEMORY DEVICE

CROSS-REFERENCE TO RELATED APPLICATION

This application is based on and claims the benefit of priority from the prior Japanese Patent Application No. 2003-132091, filed on May 9, 2003, the entire contents of which are incorporated herein by reference.

BACKGROUND OF THE INVENTION

1. Field of the Invention

This invention relates to a semiconductor memory device of the type having a one-transistor/one-cell structure as formed on a silicon-on-insulator (SOI) substrate.

2. Description of Related Art

Recently, for the purpose of alternative use or replacement of conventional dynamic random access memory (DRAM) devices, a semiconductor memory device that has a more simplified cell structure for enabling achievement of dynamic storability has been proposed. This type of memory is disclosed, for example, in Takashi Ohsawa et al., "Memory Design Using One-Transistor Gain Cell on SOI", ISSCC Digest of Technical Papers, 2002, pp. 152–153.

A memory cell is structured from a single transistor which has an electrically floating body (channel body) as formed on a silicon-on-insulator (SOI) substrate. This memory cell offers two-value data storing capabilities while regarding the state that an excess number of majority carriers are accumulated or stored in the body as a first data state (for example, logic "1" data) and letting the state that the excessive majority carriers are drawn out from the body be as a second data state (e.g. logic "0" data).

The one-transistor memory cell of the type stated above will be referred to hereinafter as a floating-body cell (FBC). A semiconductor memory using FBCs will be called the "FBC memory". The FBC memory makes use of no capacitors unlike currently available standard DRAM chips so that this one-transistor/no-capacitor or "capacitor-less" cell memory is, simpler in memory cell array structure and smaller in unit cell area than ever before. Thus FBC memory is readily scalable in cell structure and advantageously offers much enhanced on-chip integration capabilities.

For writing logic "1" data in the FBC memory, impact ionization near the drain of a memory cell is utilized. More specifically, giving appropriate bias conditions for permitting flow of a significant channel current in the memory cell, causes majority carriers that are produced by impact ionization to be stored in the floating body. Writing logic "0" data is performed by setting a PN junction between the drain and the body in a forward bias state to thereby release the body's majority carriers toward the drain side.

A difference in the carrier storage states of such floating body appears as a difference in threshold voltage of a transistor. Thus it is possible to determine or sense whether the resultant read data is a logic "0" or "1" by detecting whether an appreciable cell current is present or absent, alternatively, whether the cell current is large or small in magnitude, while applying a prespecified read voltage to the gate of a presently selected memory cell. Excess majority carriers of the body would be drawn out through the PN junctions between the source, drain and the body when letting the cell be unprocessed for an increased length of time period. Thus a need is felt to perform refresh operations at constant time intervals as in ordinary DRAMs.

For improving the characteristics of the FBC memory, it has also been proposed to employ in addition to the main gate of a memory cell an auxiliary gate which is capacitively coupled to the floating body. This approach has been disclosed, for example, in Published Japanese Patent Application Nos. 2002-246571 and 2003-31693.

The FBC memory is provided for replacing the conventional DRAM. For this purpose, it is required of the FBC memory to have high-speed performance as being equal to or higher than that of the conventional DRAM. However, the bit line of the FBC memory must be held at a low level during reading in order to prevent impact ionization. Due to this, it is not easy to flow a large cell current, thereby resulting that it is not easy to obtain high-sensitivity. If impossible to flow a large cell current, it takes a long time period for charging/discharging the bit line connected to a memory cell, whereby it becomes impossible to perform high-speed read operation.

SUMMARY OF THE INVENTION

A semiconductor memory device includes:

a device substrate having a semiconductor layer separated by a dielectric layer from a base substrate;

a memory cell array having a plurality of memory cells formed and arranged on the semiconductor layer of the device substrate, each memory cell having a MOS transistor structure with a body in an electrically floating state to store data based on a majority carrier accumulation state of the body; and a sense amplifier circuit configured to read out data of a selected memory cell in the memory cell array to store the read data in a data latch, then transfer the read data to an output circuit and write back the read data into the selected memory cell.

DETAILED DESCRIPTION OF THE EMBODIMENTS

Illustrative embodiments of this invention will be explained with reference to the accompanying drawings below.

Figure 7:
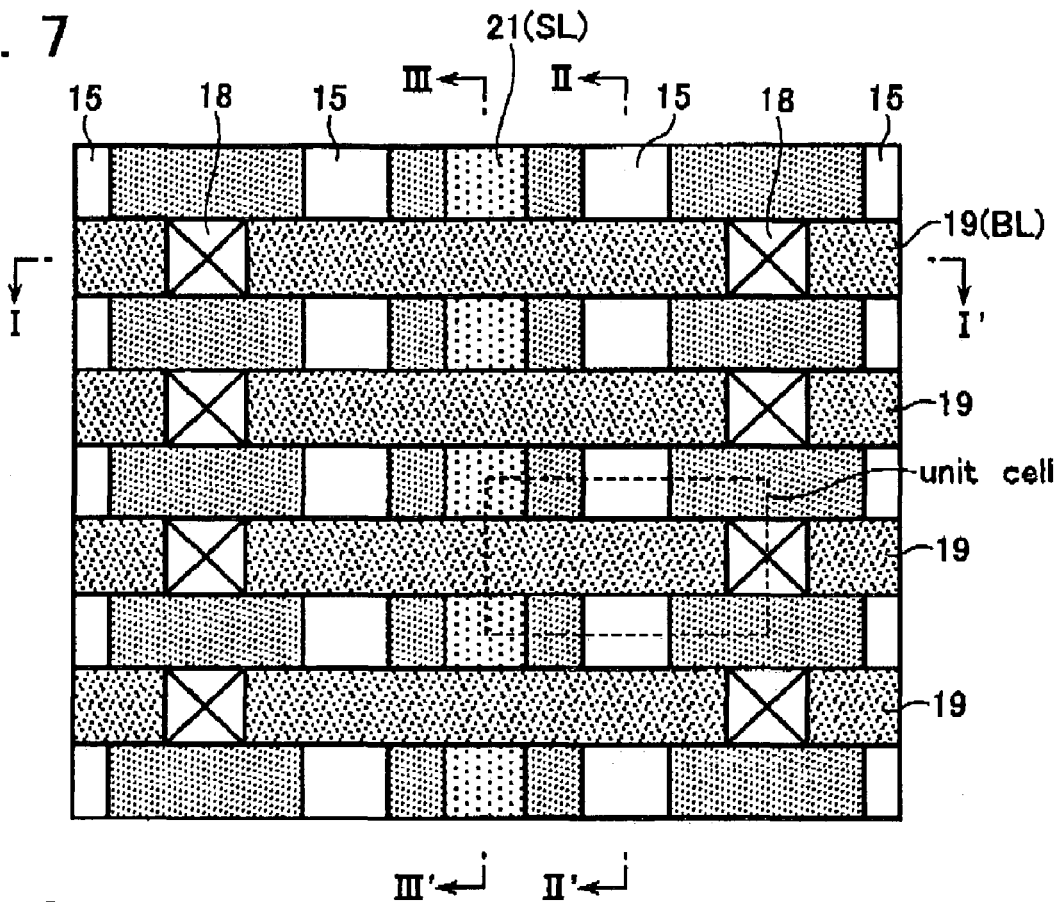
FIG. 7 shows a layout of the memory cell array.
Figure 8:
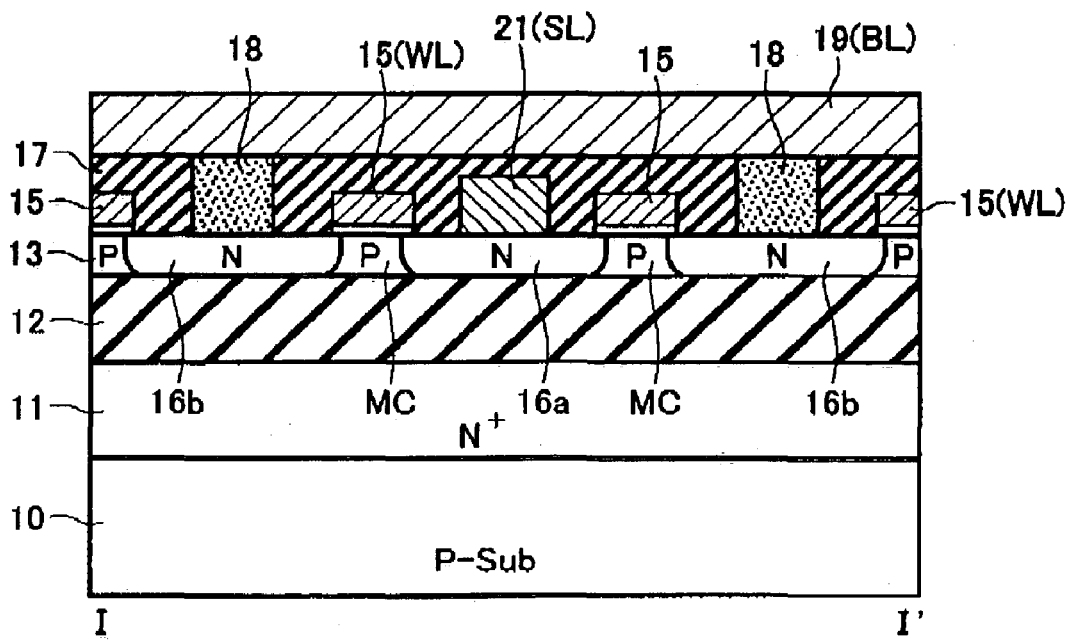
FIG. 8 shows a sectional view of the memory cell array taken along line I–I' of FIG. 7.

An explanation will first be given of the configuration of a memory cell array of a floating-body cell (FBC) memory device in accordance with one embodiment of the invention. FIG. 7 depicts a plan view of main part of the memory cell array, and FIGS. 8 to 10 are cross-sectional views of the cell array as taken along lines I–I', II–II' and III–III', respectively.

The FBC memory has a silicon substrate 10 of P-type conductivity serving as a base substrate. The P-type substrate 10 has a top surface in which a heavily doped N ($N^+$)-type layer 11 is formed with its surface covered or coated with an electrically insulative or dielectric film 12. This film may be a silicon oxide film or the like. On the dielectric film 12, a P-type silicon layer 13 is formed for use as an active layer which is electrically separated or isolated from substrate 10, thereby providing a silicon-on-insulator (SOI) substrate structure. On the silicon layer 13 of such SOI substrate, insulated gate electrodes 15 are formed. Each gate electrode 15 is associated with N-type source and drain diffusion layers 16a and 16b formed in silicon layer 13 to thereby constitute a memory cell MC which consists of a single N-channel metal oxide semiconductor (NMOS) transistor having an electrically floating body. This memory cell is called the floating-gate cell (FBC).

The silicon layer 13 is patterned into a plurality of stripe-shaped portions in a similar manner to bit lines (BL) 19 to be later formed. An empty space between adjacent ones of these strips is buried with an interlayer dielectric (ITL) film 14. A plurality of memory cells MC are laid out at each the stripe-patterned portions of silicon layer 13 in such a manner that a source/drain suffusion layer 16a, 16b is shared by neighboring cells. The gate electrode 15 is formed as an elongate conductive pattern which continues to span multiple memory cells MC which are arrayed in a direction crossing the bit lines (BL) 19, and is for use as one of word lines WL. The source diffusion layers of 16a memory cells are commonly connected together to a source line (SL) 21 which extends in parallel to the word lines. An ITL layer 17 is formed to cover the cell array. Bit lines 19 are disposed on this ITL layer 17. A bitline 19 is connected through a contact plug 18 to the drain diffusion layer 16b of each of linearly aligned or "queued" memory cells MC associated with the bitline 19 in the cell array.

Figure 9:
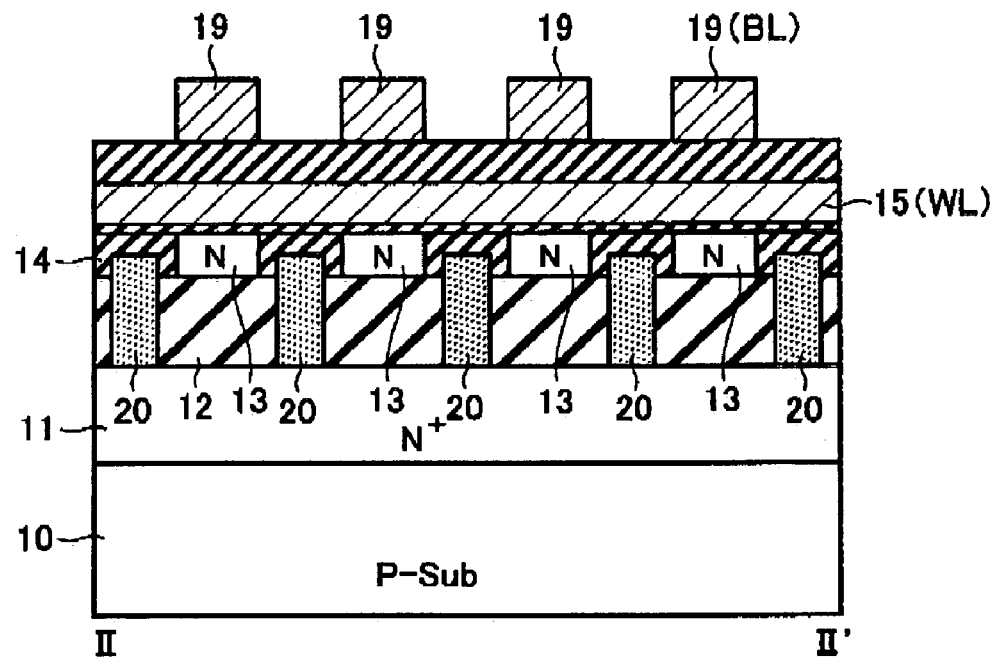
FIG. 9 shows a sectional view of the memory cell array taken along line II–II' of FIG. 7.
Figure 10:
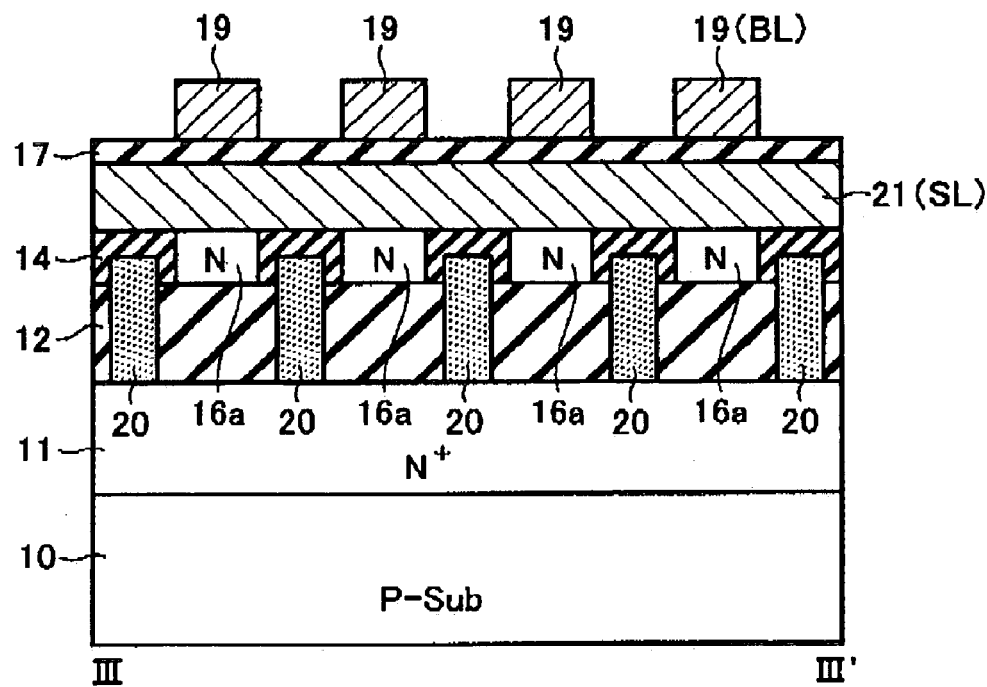
FIG. 10 shows a sectional view of the memory cell array taken along line III–III' of FIG. 7.

As better shown in FIGS. 9 and 10, laterally spaced-apart pillars 20 made of polycrystalline silicon or polysilicon are buried in the dielectric films 12 and 14 to be disposed between adjacent ones of the bitlines 19. The pillar 20 vertically extends to penetrate dielectric film 12 so that its lower end is in contact with the underlying $N^+$-type silicon layer 11 while letting its upper end be located within dielectric film 14 to thereby capacitively couple with the lower end of a floating body of its associated memory cell MC. This pillar 20 functions as an auxiliary gate for potential control of the memory cell body. For example, applying a negative voltage to pillar 20 through silicon layer 11 makes it possible to retain the hole accumulation or storage state (logic "1" data state) of the floating-body memory cell MC within an increased length of time period.

Figure 11:
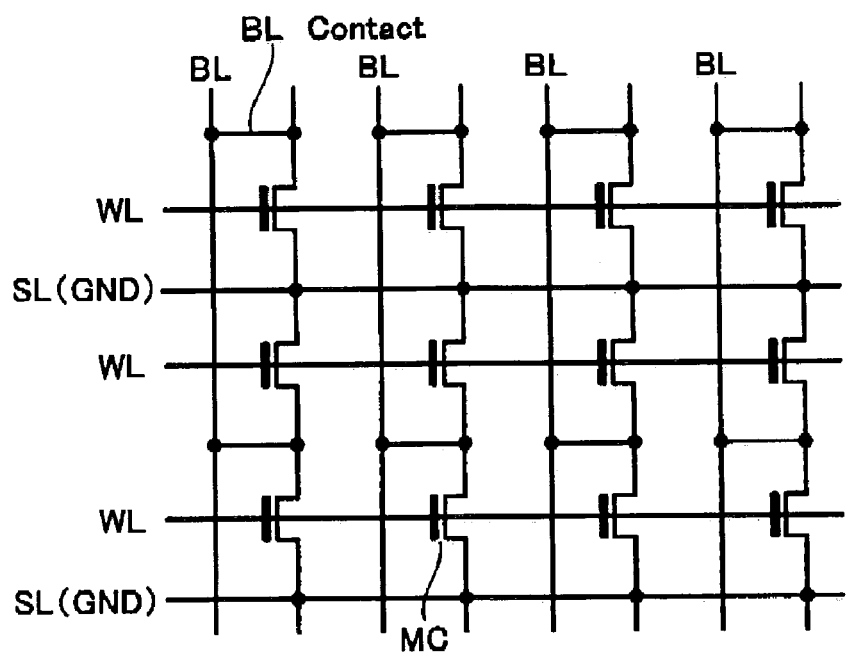
FIG. 11 shows an equivalent circuit of the memory cell array.

In this way, the memory cell array with a matrix layout of floating-body cells MC is obtained as shown in FIG. 11. Each memory cell MC consists essentially of a single transistor so that the resultant unit cell area is kept smaller as indicated by dotted lines in FIG. 7. Thus it is possible to achieve higher on-chip memory-cell integration with much increased or ultrahigh densities.

Figure 12:
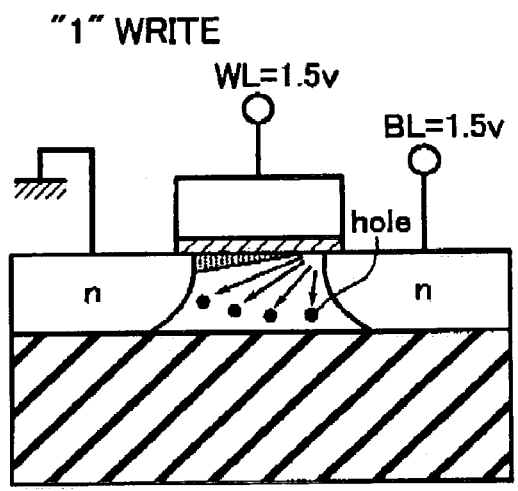
FIG. 12 shows a principle of data "1" write into a memory cell.

Operation principles of the FBC memory will next be explained with reference to FIGS. 12 to 15. The source line SL is constantly set at ground potential GND in any events. For logic "1" data writing, apply to a selected word line and a selected bit line a specific voltage which permits a memory cell as selected thereby to operate in a pentode region. For example as shown in FIG. 12, apply a voltage of 1.5 volts (V) to the selected wordline WL while giving a 1.5V voltage to the selected bitline BL. With this voltage application, the selected memory cell operates in the pentode region (current saturation region), and causes a channel current to flow while at the same time allowing impact ionization to occur at part near the drain of the selected cell. The impact ionization results in production of majority carriers—here, holes. These holes behave to move or drift down below the floating body and then are stored therein. This excess hole accumulation state of the body is regarded as a logic "1" data storing state.

Figure 13:
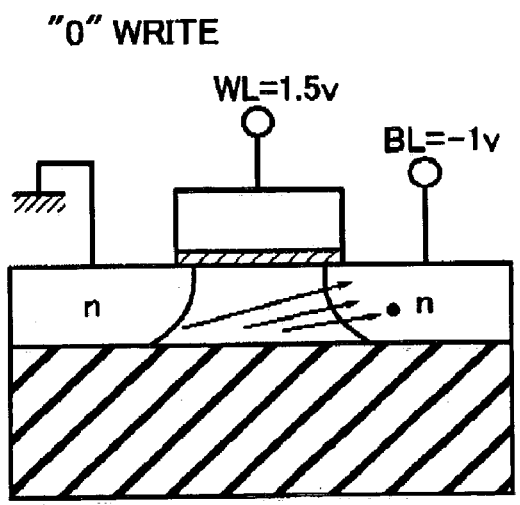
FIG. 13 shows a principle of data "0" write into a memory cell.

For writing logic "0" data, a forward bias current flowable between the drain and the floating body of a memory cell is utilized. For example as shown in FIG. 13, a negative voltage of −1V is applied to a presently selected bit line BL while simultaneously giving a 1.5V voltage to a selected word line WL. With such voltage application, the holes that are stored in the floating body of a selected memory cell are drawn out from the body toward the bitline BL through the forward-biased PN junction. The resulting state with no excess holes in the body is the data "0" storage state.

Figure 14:
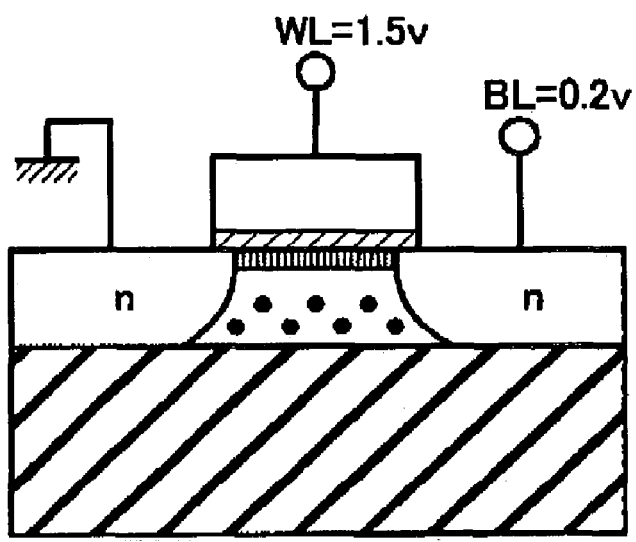
FIG. 14 shows a principle of data read of the memory cell.
Figure 15:
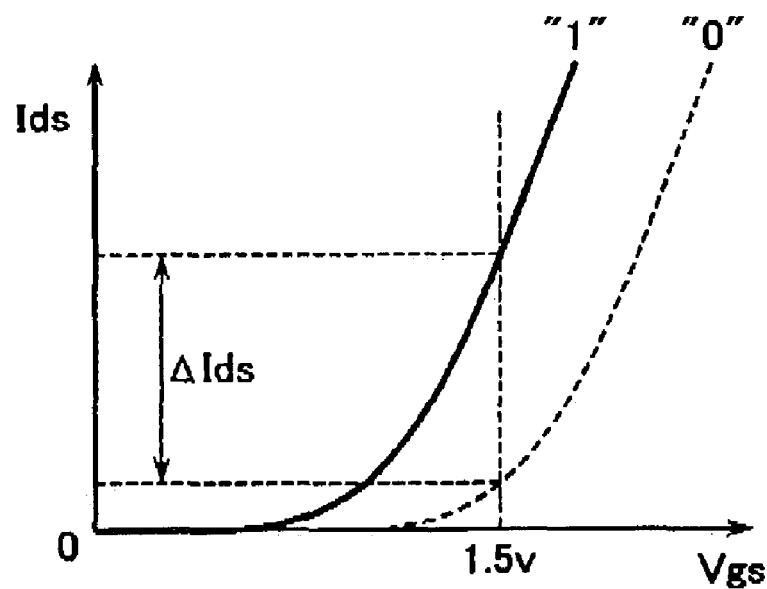
FIG. 15 shows a current characteristic of the memory cell.

After completion of data write, the stored data is retained by applying to the wordline WL a holding voltage with the negative polarity, for example, −1.5V. Data read is done by potentially biasing the memory cell in its turn-on state which precludes occurrence of impact ionization and then detecting a cell current flowing therein. For example as shown in FIG. 14, a voltage of 1.5V is applied to the selected word line WL and a 0.2V voltage is applied to the selected bit line BL. Whereby, the memory cell of interest is set in an on-state within a triode operation region (linear region). The floating body's hole storage state, which differs depending upon whether data "0" or "1" is stored therein, becomes a difference in back-bias, which in turn leads to a difference in threshold voltage of the memory cell. Accordingly, the memory cell is different in current characteristics curve in a way depending on whether the stored data is a logic "0" or "1" as shown in FIG. 15. Thus it is possible to determine or identify whether the stored data is a logic "0" or "1" by detecting a cell current difference $\Delta Ids$ between the both.

During data reading, data destruction at the selected memory cell is avoidable by utilizing the linear transistor operation region that is free from occurrence of impact ionization. Regarding non-selected memory cells, data destruction hardly occurs thereat by setting their associated wordlines WL at −1.5V and bitlines BL at 0V.

The above-described are basic write and read operations. This embodiment is provided for the purpose of achieving a high-speed data read operation. That is, in this embodiment, a practical data read scheme is utilized as follows: (1) apply a read bias condition in which impact ionization tends to be occurred in comparison with that of the basic read operation; and (2) write back the read out data just after having been read out. A detailed read operation with such the scheme will be explained later.

Figure 16:
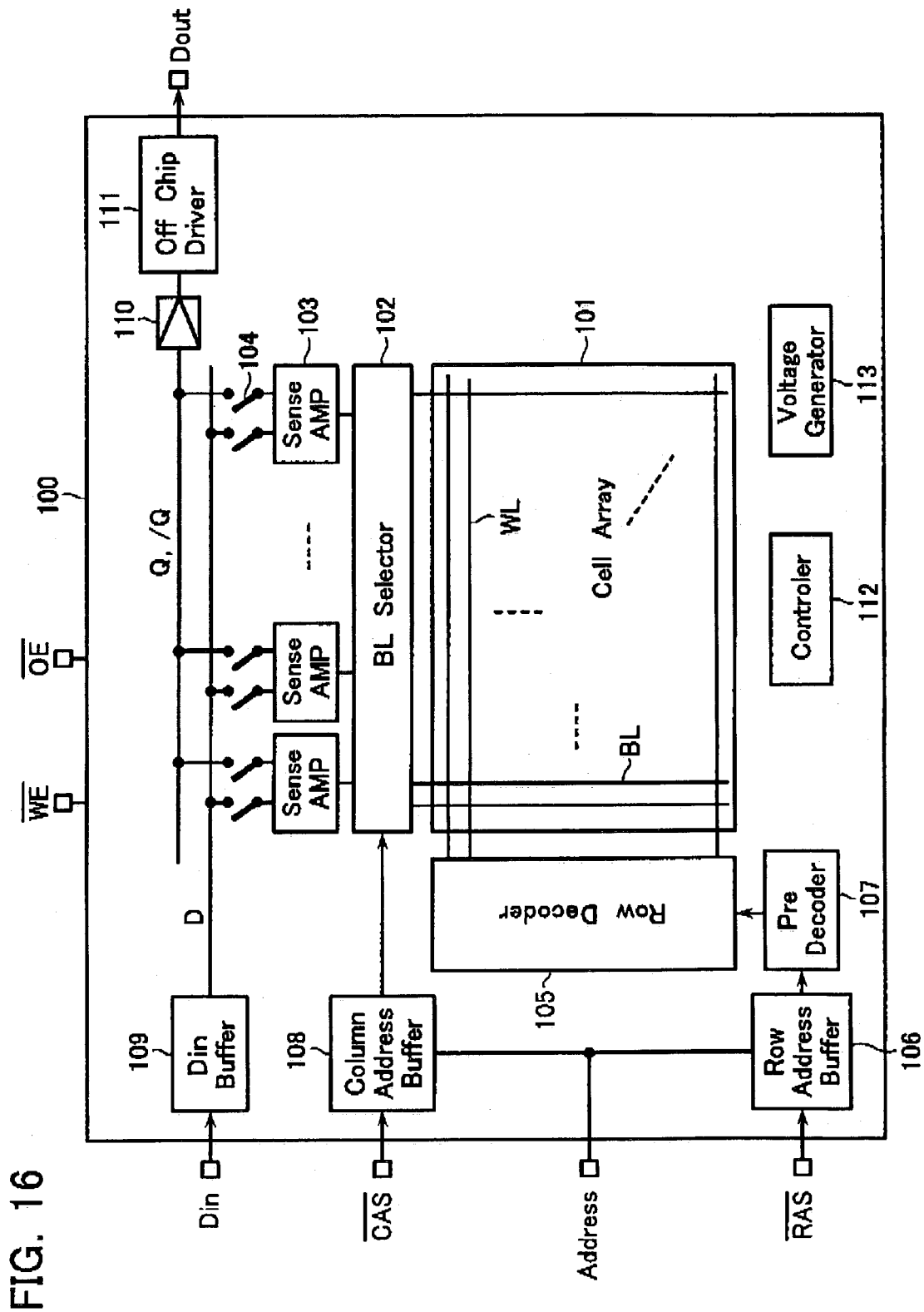
FIG. 16 shows a configuration of a memory chip.

FIG. 16 shows a configuration of a FBC memory chip 100 in accordance with this embodiment. The memory chip 100 has a memory cell array 101, which is preferably subdivided into cell units each being associated with a prespecified number of parallel bit lines BL. The bit lines BL of each cell unit are selectable by a bit line selector (BLS) circuit 102. In view of the fact that the FBC memory is aimed at successful replacement of currently available DRAM chips, the FBC memory is designed to employ address multiplexing architectures with the controllability by column address strobe (/CAS) and row address strobe (/RAS) signals in a similar way to DRAMs. A row address signal is taken out by a row address buffer 106 and is then supplied to a row decoder 105 through a pre-decoder 107. The row decoder 105 is operatively responsive to receipt of the row address signal, for selecting one from among the wordlines WL of the memory cell array 101. A column address signal is taken out of a column address buffer 108 and then passed to the bitline selector 102 for execution of bitline selection.

Bit lines BL selected by the bitline selectors 102 are connected to sense amplifier circuits 103. The sense amplifier circuits 103 are selectively conn cted to read-use data lines Q, /Q and a write-use data line D. Write data is supplied from an input pad Din to the write-use data line D through an input buffer 109. The write data on the data line D is supplied to a bit line BL through the sense amplifier circuit 103 and bitline selector 102. Read out data is transferred to the data line Q, /Q, and output to a data output pad Dout through an output circuit configured of an output buffer 110 and off-chip driver 111.

The FBC memory chip 100 is provided with other circuits including a controller 112 which generates a variety of kinds of control signals and a voltage generation circuit 113 for generating various internal voltages required.

Figure 1:
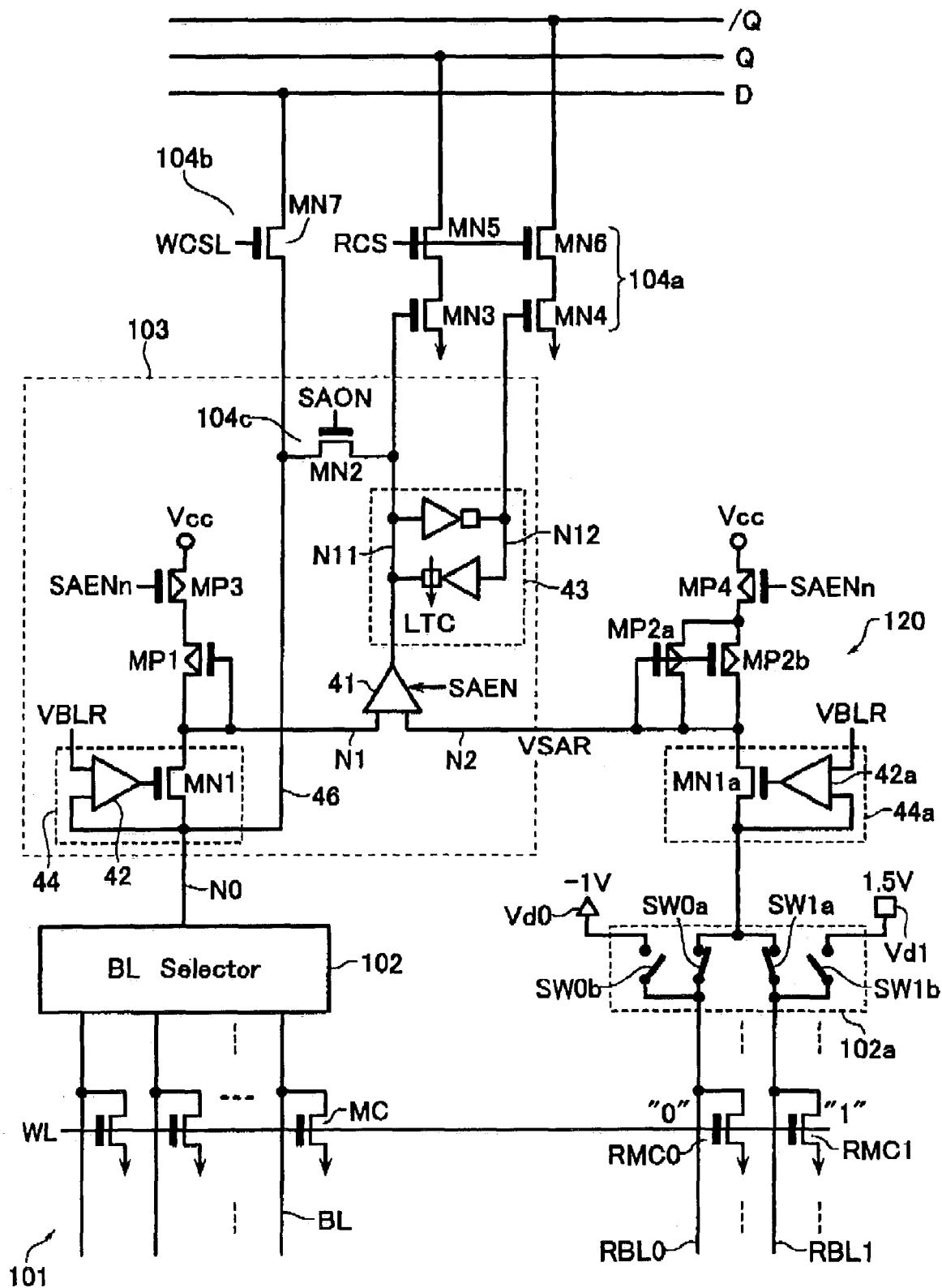
FIG. 1 shows a configuration of a sense amplifier circuit of an FBC memory in accordance with an embodiment of the present invention.

Referring to FIG. 1, a sense circuit system of the FBC memory of this embodiment will be described in detail bellow. Sense amplifier circuit 103 has an operational amp 41 with a sense node N1, to which a read data is transferred from a bit line of cell array 101, and a reference node N2 to which a reference voltage VSAR is applied. The sense node N1 is connected to a bit line BL of the cell array 101 through a clamp circuit 44 and a bit line selector 102. The sense node N1 is also connected to a power supply node Vcc through a diode-connected current source load PMOS transistor MP1 and a sense amp activating PMOS transistor MP3. It should be appreciated that the load-transistor MP1 may be replaced with a resister. The reference voltage VSAR applied to the reference node N2 is set at an intermediate voltage value between "1" and "0" read data voltages generated at the sense node N1, which is generated from a reference voltage generation circuit 120.

The clamp circuit 44 serves for clamping the bit line voltage in order to set a voltage applied to the drain of a selected memory cell in a read mode. For this purpose, the clamp circuit 44 is configured to have a clamping NMOS transistor MN1 disposed between the sense node N1 and a node N0 of the bit line selector 102 and an operational amp 42 for controlling the gate of the transistor MN1 by feedback of the bit line voltage. A reference voltage VBLR is applied to a reference input of the operational amp 42, whereby the bit line voltage is set at VBLR in the read mode.

Connected to the output nod N11 of the operational amplifier 41 is a data latch 43 serving for holding a read,data and a write data. NMOS transistors MN3 and MN4, which are gate-controlled by two nodes N11 and N12 respectively, and NMOS transistors MN5 and MN6, which are disposed between the drains of the MNOS transistors MN3 and MN4 and data line Q and /Q, respectively, constitute a transfer circuit 104a for outputting a read out data. The NMOS transistors MNS and MN6 are commonly gate-driven by a control signal RCS to turn on when a read out data is output.

An NMOS transistor MN7 disposed between a data write-use data line D and the node N0 of the bit line selector 102 serves as a transfer circuit 104b for transferring a write data to the cell array. The write data may be directly transferred to the node N0 through the NMOS transistor MN7 and the write data transferring line 46 as being a bypath of the clamp circuit 44. However, in this embodiment, the write data supplied from the dada line D is stored in the dada latch 43 for a time.

Therefore, a NMOS transistor MN2 disposed between the node N11 of the data latch 43 and the write data transferring line 46 serves as a transfer circuit 104c for transferring the write data to the cell array 101. In this embodiment, this transfer circuit 104c serves for also writing back the read data in the data latch 43 into the selected cell of the cell array.

It is required to set the reference voltage VSAR at an intermediate voltage between voltages of read data "1" and "0" which are generated at the sense node N1. Therefore, in this embodiment, two reference cells RMC1 and RMC0, into which data "1" and "0" are written respectively, are prepared in the reference voltage generating circuit 120. The reference voltage generating circuit 120 is configured to compose the cell currents I1 and I0 of the reference cells RMC1 and RMC0 to output the reference voltage VSAR.

The reference cells RMC1, RMC0 have the same structure as the memory cell MC and are driven by the same word line WL as the memory cell MC. Reference bit lines RBL1, RBL0, to which the reference cells RMC1, RMC0 are connected, are connected to the reference node N2 via a switch circuit 102a and a dummy clamp circuit 44a. The switch circuit 102a has transfer gates SW1a, SW0a serving as dummy select gates, which are simultaneously on-driven in the read mode to connect the reference bit lines RBL1, RBL0 to the reference node N2.

The switch circuit 102a further has transfer gates SW1b, SW0b serving for writing reference data "1", "0" into the reference cells RMC1, RMC0, respectively. These transfer gates SW1b, SW0b are connected to power supply lines Vd1, Vd0 which are set at bit line voltages 1.5V, −1V necessary for reference data writing, respectively.

The dummy clamp circuit 44a is configured similarly to the clamp circuit 44 to be used for clamping voltages of the reference bit lines RBL1, RBL0 in the read mode. To the reference node N2, two current source load PMOS transistors MP2a, MP2b, which are diode-connected, are connected. Each of these load transistors MP2a, MP2b has the same size and current drivability as the load PMOS transistor MP1. In place of these two load PMOS transistors MP2a, MP2b, one load PMOS transistor, current drivability of which is twice as high as that of the load transistor MP1 at the sense node N1, may be used.

By use of such the reference voltage generation circuit 120, each of the load PMOS transistors MP2a, MP2b flows current as being a half of the sum of cell currents of the reference cells RMC1, RMC0. In detail, suppose that when a memory cell is selected in the cell array 101, cell current Icell1 or Icell2 flows corresponding to data "1" or "0", the reference cells RMC1 and RMC0 are simultaneously selected in the reference voltage generating circuit 120 to flow cell currents I1 and I0, respectively. Based on these cell currents I1 and I0, each current of the load PMOS transistors MP2*a* and MP2*b* becomes to be (I0+I1)/2. As a result, at the reference node N2, the reference voltage VSAR, which is an intermediate value between the read out voltages of data "1" and "0", may be generated.

Next, a data read operation of the FBC memory of this embodiment will be explained. The outline is as follows. First, in this embodiment, the bit line voltage (i.e., drain voltage) is set at a higher level than that of the prior art during the read operation. By use of such high bit line voltage, the cell current is increased, thereby causing the bit line quick charge/discharge. In addition, as a result of the voltage amplitude increasing at the sense node, the sensitivity becomes high. On the other hand, setting the bit line voltage high, impact ionization occurs. This leads to fear of "0" data disturbance. However, set the bit line voltage at a lower level than that of "1" write operation (i.e., about 1.5V), and it is able to suppress the amount of holes generated by impact ionization. As a result, it is possible to retain the data state without being lost during one read operation.

Figure 17:
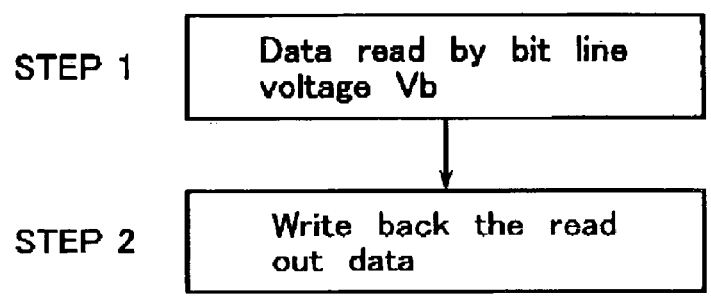
FIG. 17 shows a sequence of a data read operation in accordance with the embodiment.

Even if the data is not destroyed in one read operation, when data read operations are repeated some times, the data will be destroyed. In consideration of this, second, write back is performed after each data read operation in this embodiment. More specifically, as shown in FIG. 17, a read sequence with two steps is used as follows: data read with a bit line voltage Vb higher than the bit line voltage Va in the prior art (STEP1); and then write back the read out data (STEP2).

Figure 18:
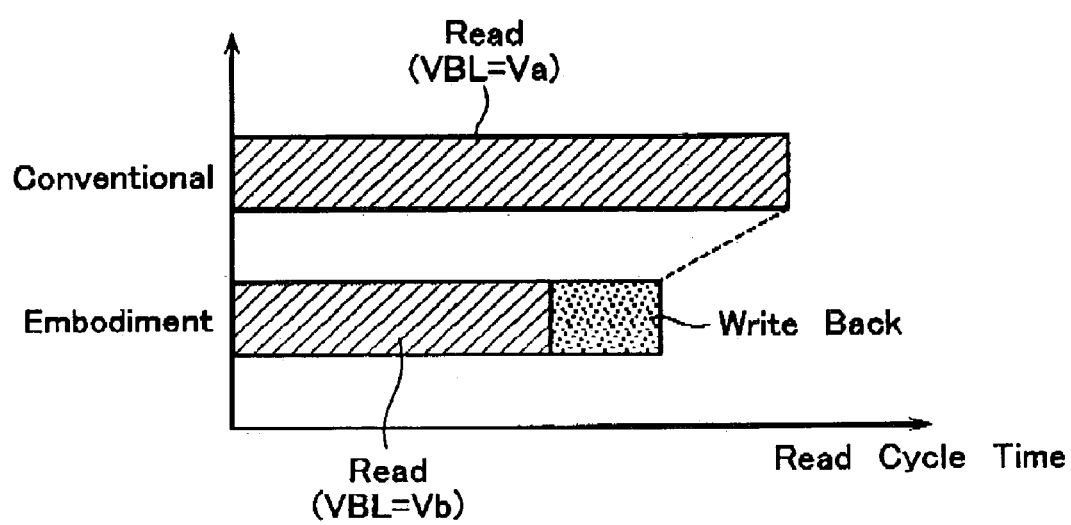
FIG. 18 shows a read cycle time of the embodiment in comparison with a prior art.

Note here that data write back is necessary for only "0" data because only "0" data cell is disturbed by the read operation. "0" data write is done by applying a forward bias to the PN junction of the drain side of the cell so as to draw out the accumulated holes in the body. Therefore, "0" data write is done in a shorter period in comparison with "1" data write that slowly accumulates holes in the body by impact ionization. In addition, although the drain voltage is higher than that in the prior art, it is limited at a lower level than that in "1" data write operation. Therefore, since the amount of holes generated during the read operation is a little, the threshold shift of the "0" data state will be small. This results that the period necessary for writing back becomes shorter than that of the ordinary data write. As described above, according to the read sequence of this embodiment, it is possible to make the read cycle time obtained by summing up write back time and read time shorter than the conventional read time, as shown in FIG. 18.

Figure 19:
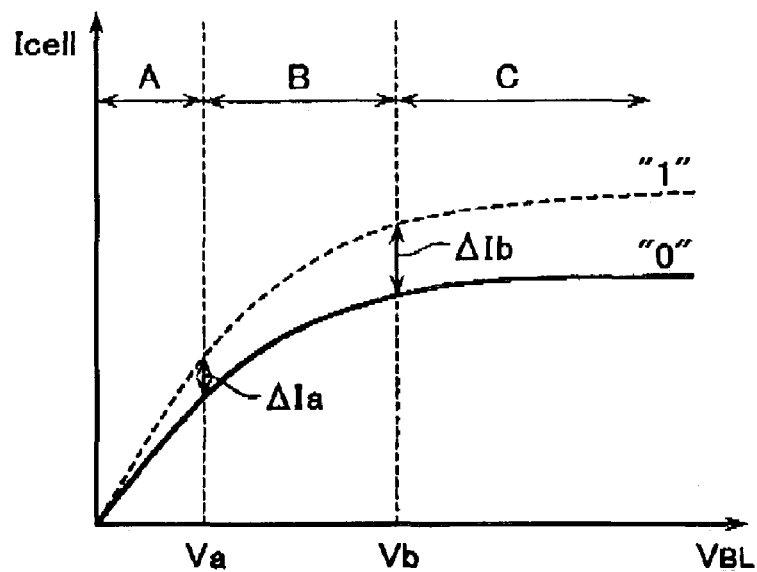
FIG. 19 shows a characteristic of cell current depending on bit line voltage.

Next, a method of setting the bit line voltage Vb in the read operation according to this embodiment will be described in detail. FIG. 19 shows a relationship between the cell currents, Icell, during data "1" and "0" read operations and the bit line voltage (i.e., drain voltage), $V_{BL}$. As shown in FIG. 19, the cell current characteristic may be divided into three regions A, B and C in correspondence with the bit line voltage $V_{BL}$. Region A is one in which the bit line voltage $V_{BL}$ is set at such a low level that hardly causes the cell impact ionization occurrence. Use the bit line voltage in this region, and even if read operations are repeated until the cell data is refreshed, the cell data is not destroyed. In the prior art, it has been considered to use such the bit line voltage.

The region B has a higher bit line voltage than that of the region A. In this region B, although impact ionization occurs a little, cell current is larger than that of the region A, and the difference between cell currents of data "1" and "0" is larger than that of the region A. However, the amount of holes generated by impact ionization is less than that in "1" write operation. As a result, although one read operation does not destroy "0" data state, it will be destroyed while multiple read operations are repeated in a refresh cycle.

In the region C, the bit line voltage is higher, and the amount of holes is larger than the region B. Therefore, "0" data will be destroyed in one data read operation. The cell current and difference between cell currents of data "1" and "0" are nearly equal to those in the region B.

In this embodiment, the bit line voltage $V_{BL}$ as being defined in the region B is used. Use such the bit line voltage, and the difference between cell currents of data "1" and "0" becomes large, thereby resulting that sensibility becomes high. The reason of this will be explained as follows.

Suppose that word line voltage is $V_{WL}$ in the read operation, cell current, Icell, will be expressed by use of cell threshold, Vth, as follows.

$$Icell=\beta(V_{WL}-Vth-V_{BL}/2)V_{BL} \quad (1)$$

In the equation (1), β is a constant. Suppose that cell thresholds of data "1" and "0" are Vth1 and Vth0, respectively, a difference ΔIcell of the cell currents of data "1" and "0" is expressed as follows.

$$\Delta Icell=\beta(Vth0-Vth1)V_{BL} \quad (2)$$

As apparent from the equation (2), it should be appreciated that the higher the bit line voltage, $V_{BL}$, in the read operation, the larger the cell current difference, ΔIcell, thereby making sensibility high.

Next, as shown in FIG. 19, bit line voltages at the respective boundaries between the regions A, B and C are referred to Va and Vb. In this embodiment, Vb is preferably used as the bit line voltage in the read operation. Alternatively, a lower value than Vb may be used. The bit line voltage Vb is determined as follows.

Figure 20:
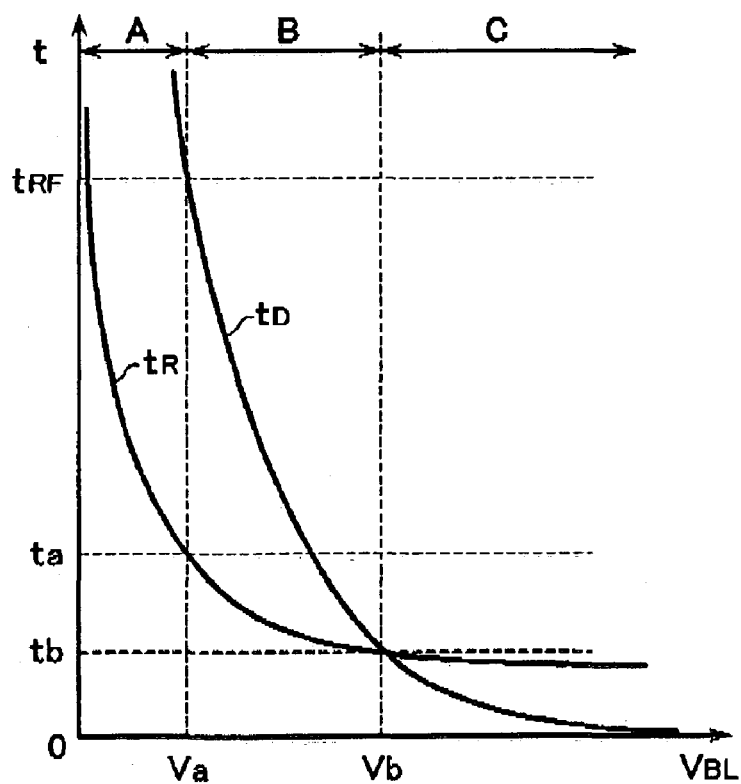
FIG. 20 shows characteristics of a read time necessary for data reading and a retention time taken for reaching to data destruction, which depend on bit line voltage.

FIG. 20 shows a time, $t_R$, necessary for reading out and storing cell data in the dada latch in the read operation, and another time, $t_D$, taken for reaching to cell data destruction by continuing the data read state, and resulting that data read becomes impossible, as functions of the bit line voltage, $V_{BL}$. The read time $t_R$ is expressed as follows.

$$t_R=C_{BL}\Delta V_{BL}/Icell+toffset \quad (3)$$

where, $C_{BL}$; bit line capacitance, $\Delta V_{BL}$; bit line voltage amplitude necessary for data sensing, and toffset; the remaining time component (e.g. period necessary for word line voltage changing, data outputting and the like) except the sensing time in the read time.

As the cell current becomes larger, read time $t_R$ becomes smaller in length. In the linear region (i.e., triode region) of the cell current characteristic, as the bit line voltage becomes higher, the cell current becomes larger. In contrast to this, in the current saturation region (i.e., pentode region), the cell current becomes independent of the bit line voltage. Therefore, even if the bit line voltage is set to be further higher, it is impossible to make read time $t_R$ shorter than a certain degree.

On the other hand, $t_D$ is a time taken to reach a data discrimination impossible state due to that the threshold of "0" data changing toward that of "1" data by continuing the read state. In other words, $t_D$ is a retention time in which it is possible to continue the data read state without data destruction. The situation of what degree shift of "0" data threshold causes data discrimination to be impossible is determined by the sense amplifier circuit. Suppose that such threshold shift is ΔVth0. The time $t_D$ taken for the threshold voltage of "0" data to be shifted by ΔVth0 is determined by the amount of holes generated by impact ionization. The impact ionization becomes remarkable in a state that the cell transistor is biased in the current saturation region. In the current saturation region, as the bit line voltage is higher, the amount of generated holes increases.

As apparent from the above description, the curves of times $t_R$ and $t_D$ cross each other at a certain point, as shown in FIG. 20. In this embodiment, in order to prevent data loss in one data read operation, it is required for selecting a bit line voltage region in which read time $t_R$ is not over retention time $t_D$. That is, the bit line voltage $V_{BL}$ at the cross point of the curves of $t_R$ and $t_D$ becomes an upper limit value Vb of the read voltage in this embodiment. The bit line voltage Va where $t_D$ becomes equal to the refresh cycle time $t_{RF}$ is a read voltage having been used in the prior art.

Figure 4:
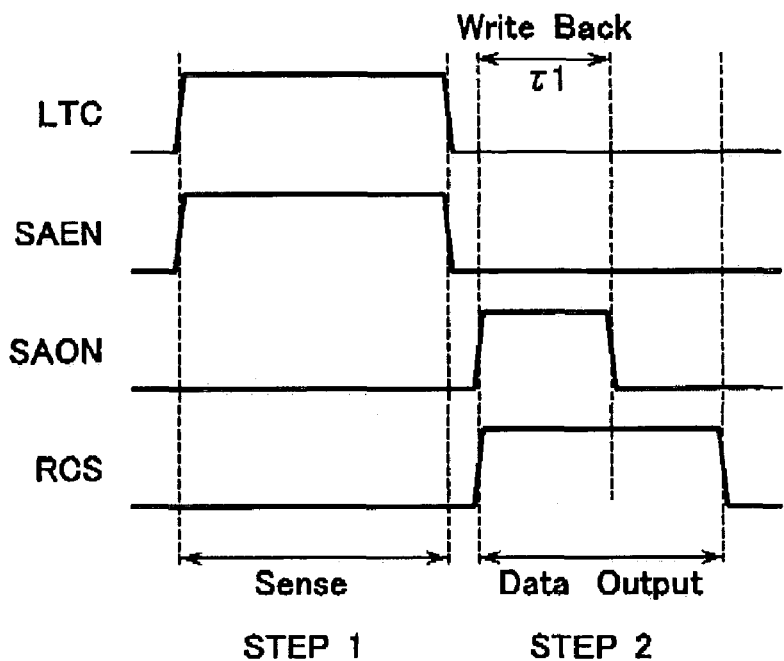
FIG. 4 shows waveforms for explanation of a read operation by the sense amplifier circuit shown in FIG. 1.

Referring to the sense amplifier circuit shown in FIG. 1, data read operation will next be described below. FIG. 4 shows waveforms of main signals in the read operation. The read operation is, as above-described, performed by two steps, STEP1 and STEP2. In the first step STEP1, set the sense amplifier activating signals SAEN and SAENn at "H" and "L", respectively, further set the latch signal LTC at "H", and sense amplifier circuit 103 is activated. A cell data selected by a word line WL and a bit line BL is transferred to the sense node N1 via bit line selector 102 and clamp circuit 44.

At this time, in the reference voltage generating circuit 120, the transfer gates SW0a and SW1a are at an on state, and SW0b and SW1b at an off state in the switch circuit 102a. As a result, data of the reference cells RMC1, RMC0 are simultaneously read out, thereby applying the reference voltage VSAR to the reference node N2. By comparing the read out voltage at the sense node N1 with the reference voltage VSAR at the reference node N2, operational amp 41 outputs read out data of "H" or "L". The read out data is stored in the data latch 43.

During the above-described read operation, the reference voltage VBLR is set as VBLR=Vb. That is, the bit line voltage of the selected cell is controlled to be set at Vb. Similarly, in the reference voltage generating circuit 120, the reference voltage, VBLR=Vb, is applied to the dummy clamp circuit 44a, and reference bit line voltage applied to the reference cells RMC1, RMC0 is controlled to be Vb.

In the second step STEP2, a write back operation is performed simultaneously with a data outputting operation for the read out data, as follows. In response to that the control signal RCS becomes "H" in the read out transfer circuit 104a, the read out data held in the data latch 42 is transferred to data lines Q, /Q to be output to outside of the chip via the data buffer. The control signal SAON of the write transfer circuit 104c becomes "H" simultaneously with the control signal RCS, whereby the read out data held in the data latch 43 is transferred to the cell array to be written back. In detail, if the read out data is "1", the node N11 of the data latch 43 is "L" (e.g –1V). If the read out data is "0", the node N11 is "H" (e.g. 1.5V). One of these voltages of the node N11 are transferred to the selected bit line, whereby data "1" or "0" write is performed (see FIGS. 12 and 13).

Figure 5:
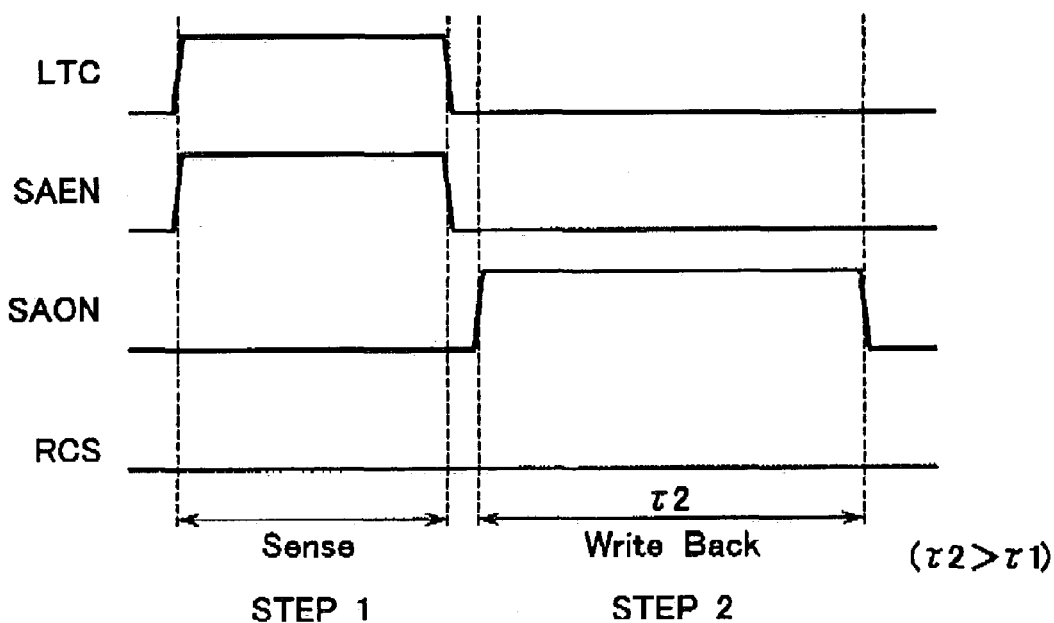
FIG. 5 shows waveforms for explanation of a data refresh operation.

A time period, τ1, for the data writing back (i.e. period of SAON="H") may be taken shorter than or equal to the read data outputting period (i.e. period of RCS="H") and the write back period, τ2, in the ordinary data refresh cycle as shown in FIG. 5. The reason of this is as follows. Data refresh is required for specifically protecting "1" data from losing due to decreasing of the accumulated holes. For this purpose, it is required to sufficiently write back with a predetermined cycle. To the contrary, the write back performed in each read cycle in this embodiment is required only for recovering "0" data threshold shift as a result of the accelerated read condition. Note here that the write back operation of the second step, STEP2, in this embodiment, is done for not only "0" data but also "1" data. However, "1" data is not disturbed by the read operation. Therefore, there is no need to take a long write back time as that of data refresh time.

In the second step, STEP2, write back operations to the reference cells RMC1, RMC0 are also performed simultaneously. That is, in the switch circuit 102a, transfer gates SW0b and SW1b become on, and transfer gates SW0a and SW1a off simultaneously with the control signal SAON="H". As a result, data "1" and "0" are written back into the reference cells RMC1 and RMC0, respectively. At this time, 1.5V and –1V voltages to be applied to the reference bit lines RBL1 and RBL0 are supplied from the internal power supply lines Vd1 and Vd0.

As described above, preparing such a function that data "1" and "0" are simultaneously written into the reference cells RMC1 and RMC0, it also becomes possible to simultaneously refresh the reference cells RMC1 and RMC0. Further, it is also possible to refresh the reference cells RMC1 and RMC0 simultaneously with the normal cll MC. As a result, it is possible to shorten the time period necessary for data refreshing. The scheme of shortening the refresh time by use of the switch circuit 102a is useful even if the scheme of shortening the read time by the above-described data read with two steps is not used.

A data write operation will next be described. A write data supplied from outside of the chip is transferred on the write-use data line D to be temporarily stored in the data latch 42 in the sense amplifier circuit 103 via the transfer circuits 104b and 104c. This write data is further transferred to a selected bit line BL through the transfer circuit 104c, transfer line 36 and bit line selector 102. The voltage transferred to bit line BL is 1.5V or –1V corresponding to data "1" or "0" (see FIGS. 12 and 13). Note that it is possible to directly transfer and write the write data from the data line D to the cell array without storing it into the dada latch 43.

Data write into the reference cells RMC1 and RMC0 are performed by transferring voltages 1.5V and –1V of the power supply lines Vd1 and Vd0 to the reference bit lines RBL1 and RBL0 via the switch circuit 102a.

As above-described, in this embodiment, a read sequence is used to include a read step STEP1, in which the bit line voltage is set higher than that in the prior art, and a write back step STEP2 for writing back the read data right after it has been read out. As a result, it is possible to shorten the read time of the FBC memory. In addition, as a result of using a high bit line voltage is used, sensibility of the FBC memory may be improved.

Figure 2:
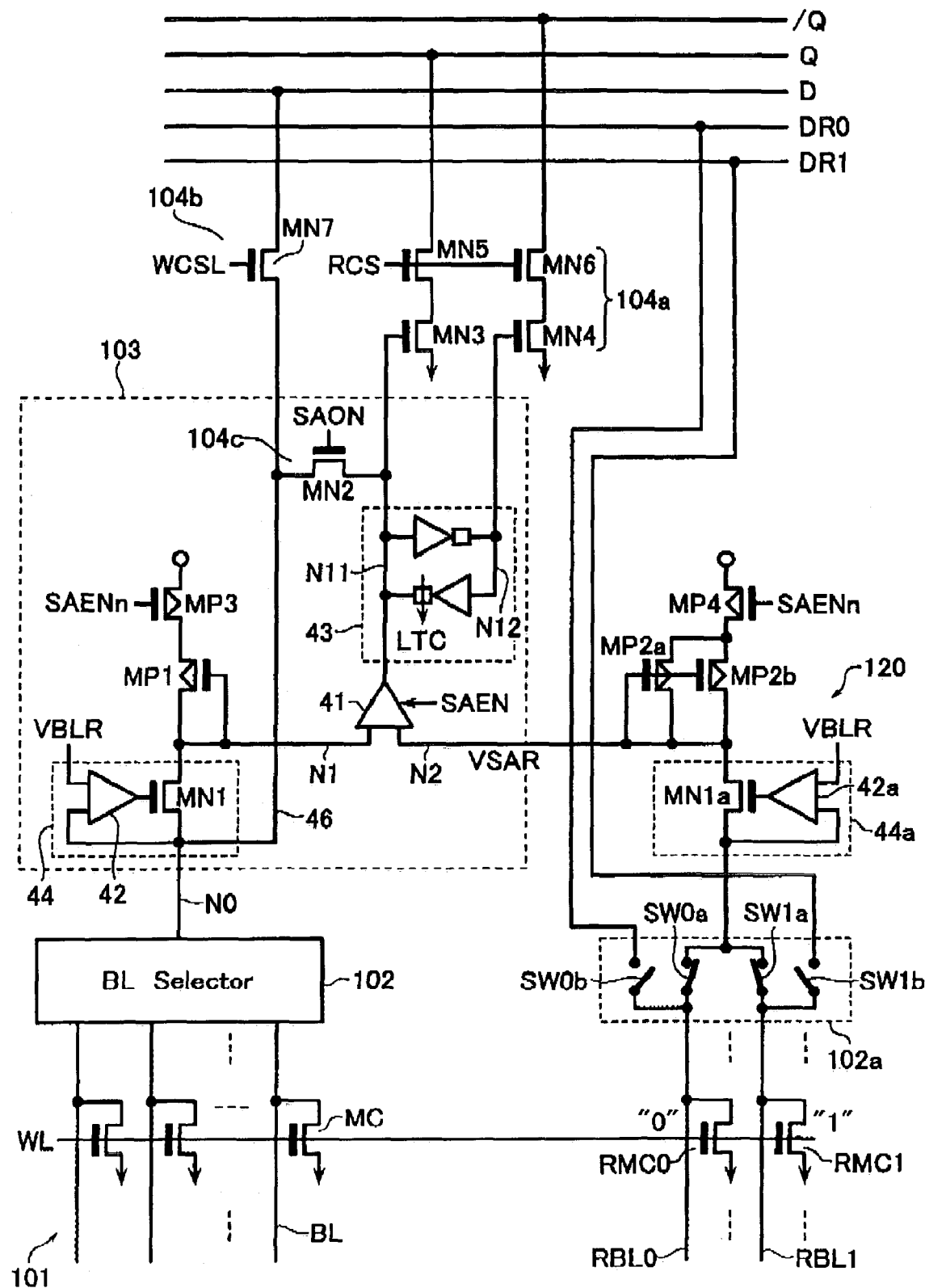
FIG. 2 shows another sense amplifier circuit.

Other sense amplifier circuit systems will be explained bellow. In FIG. 1, in order to write "1" and "0" data into the reference cells RMC1 and RMC0, power supply lines Vd1 and Vd0 are disposed to supply particular and internal power voltages. In contrast to this, FIG. 2 shows an example that write-use data lines DR1 and DR0 are disposed to be connected to the external terminals. The others are the same as those in FIG. 1.

Prepare such the data lines DR1, DR0, and it is possible to change the data of the reference cells RMC1, RMC0 by selecting input data supplied to the data lines DR1, DR0 from outside of the chip. For example, data "1", "0" of the reference cells RMC1, RMC0 may be determined as to be not static, e.g., as being reversible for each refresh cycle. This is effective because deterioration of the cell transistor due to "1" data write continuing is suppressed. Further, in a test process, it is possible to select optional write data into the reference cells RMC1, RMC0. This will increase the flexibility of the test process.

Figure 3:
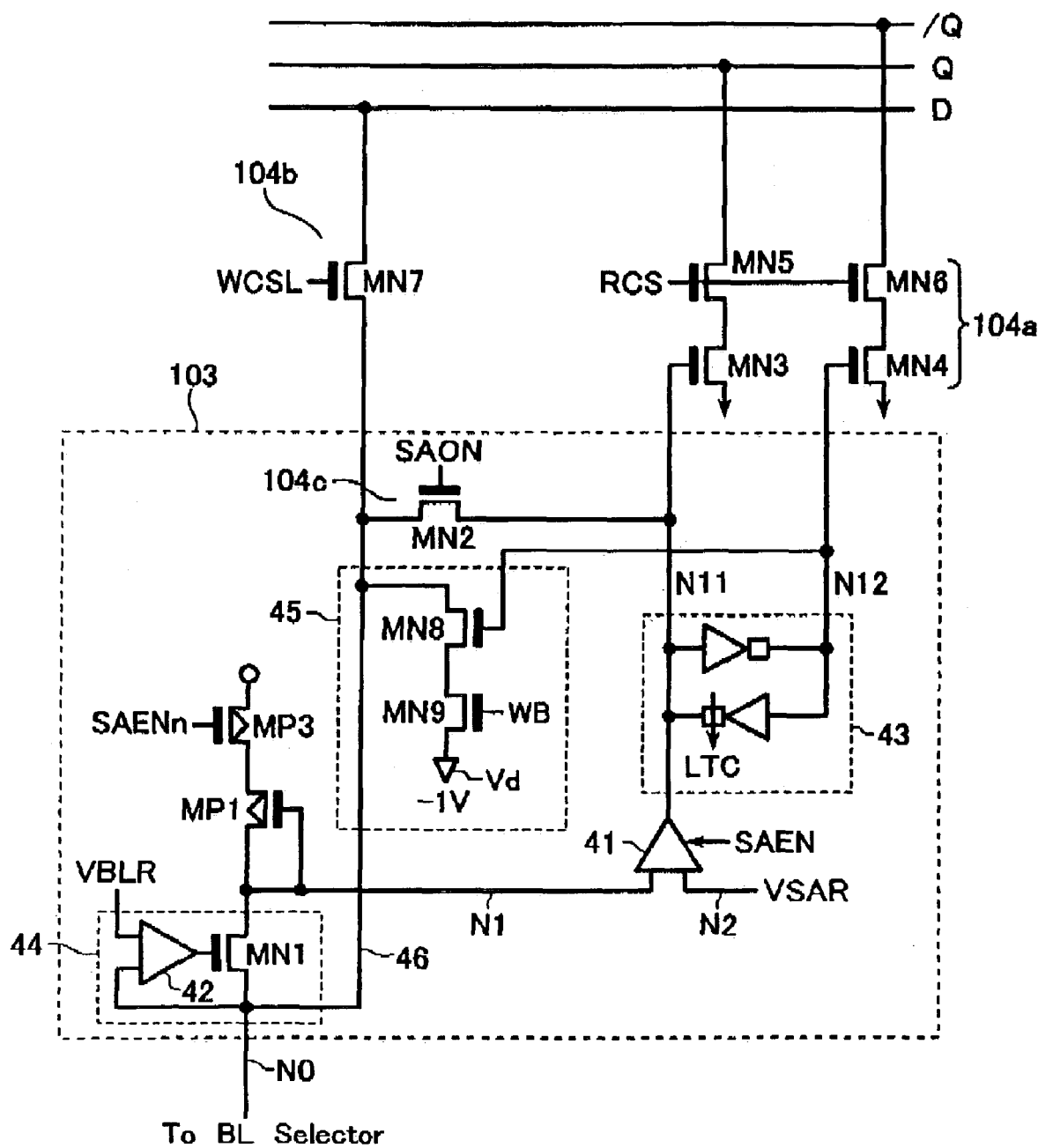
FIG. 3 shows still another sense amplifier circuit.

FIG. 3 shows another example of the sense amplifier circuit 103. In the sense amplifier circuits shown in FIG. 1 and 2, the transfer circuit 104c is used for not only normal data write operations but also write back operations in the read cycles. The write back is done also when "1" data is read out. However, "1" data write back uselessly performs bit line charge/discharge. In view of reducing power consumption, it can be said that "1" data write back is not desirable rather than it is unnecessary as described above.

To improve such the point, the sense amplifier circuit 103 shown in FIG. 3 is configured to have a write back circuit 45, which is used to perform a write back only when "0" data is read out, in addition to the transfer circuit 104c. The write back circuit 45 is composed of a serial circuit of NMOS transistors MN8 and MN9 connected to the data transfer line 46. The source of NMOS transistor MN9 is connected to a power supply line Vd which is prepared to supply "0" write-use bit line voltage, −1V, and the gate is driven by a write back-use control signal WB. The gate of NMOS transistor MN8 is driven by the node N12 of the data latch 43.

Figure 6:
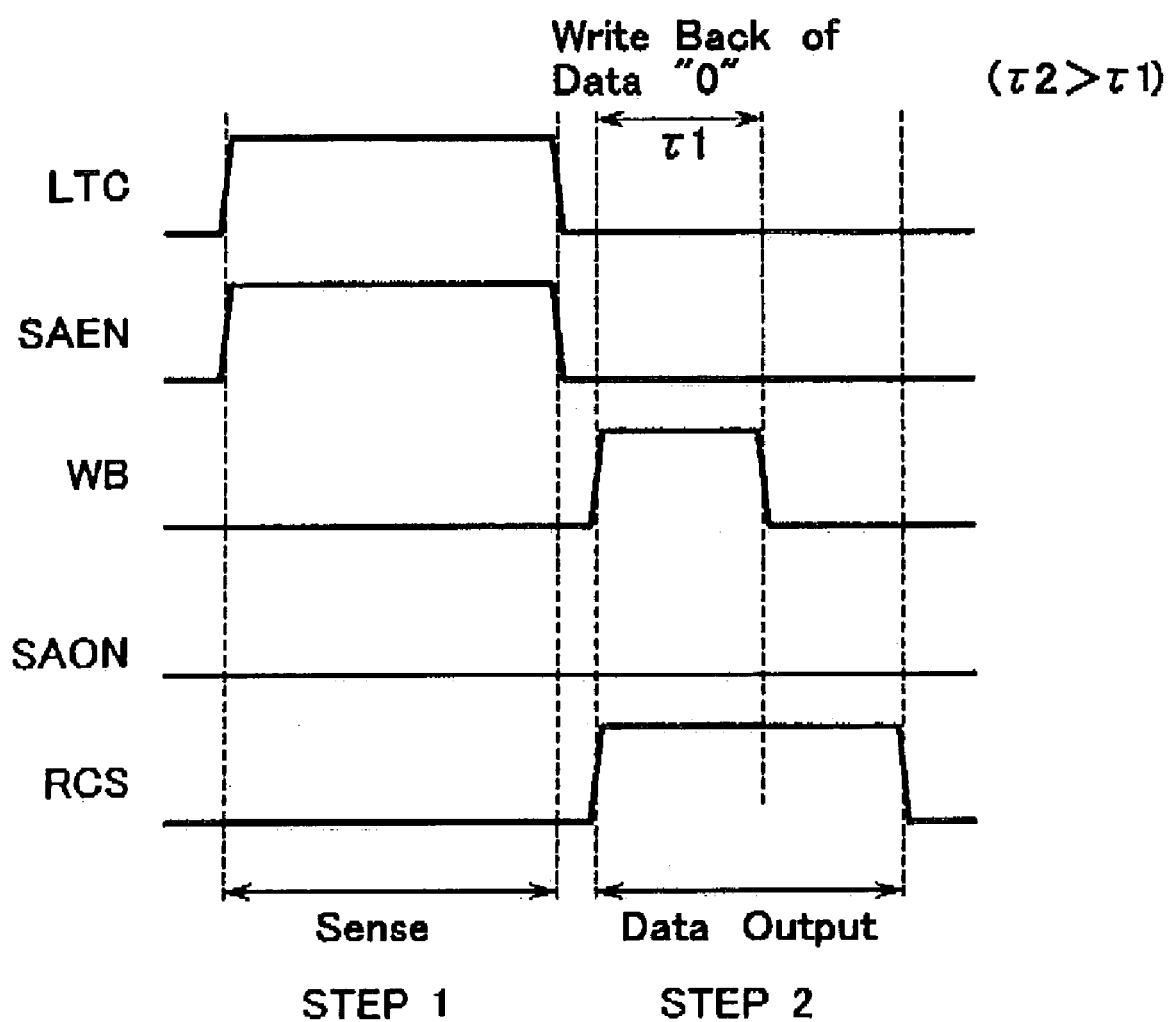
FIG. 6 shows waveforms for explanation of a read operation by the sense amplifier circuit shown in FIG. 3.

FIG. 6 shows waveforms of a data read operation using the sense amplifier circuit 103 shown in FIG. 3. The first step STEP1 is the same as that in FIG. 4. In the data write back of the second step STEP2, write back control signal WB becomes "H" without letting the control signal SAON be "H". If the read out data in the step STEP1 is "0", the node N12 of the data latch 43 becomes "H". In this case, NMOS transistors MN8 and MN9 turn on, whereby −1V is transferred to the bit line. Therefore, "0" data write back is done into the selected cell. In a case that the read data in the step STEP1 is "1", NMOS transistor MN8 is maintained at an off state, whereby write back is not performed. In this case, the bit line voltage is held in a range of $0 \leq V_{BL} \leq Vb$, thereby resulting that the cell data is held as it is.

The write back time period, τ1, in which the control signal WB is set at "H", may be shorter than or equal to the read data outputting period (i.e. period of RCS="H") and the write back period, τ2, in the ordinary data refresh cycle as shown in FIG. 5. This is the same as the case using the sense amplifier circuits shown in FIGS. 1 and 2.

This invention is not limited to the above-described embodiment. For example, while it has been explained that the memory cell has an NMOS transistor structure, it should be appreciated that the memory cell may be formed with a PMOS transistor structure. In such a case that the PMOS transistor cell structure is used, it is necessary for replacing PMOS, NMOS transistors with NMOS, PMOS transistors respectively, with respect to the respective circuit elements, and reversing the voltage relationships in the embodiment. Further, it will be understood by those skilled in the art that various changes in form and detail may be made without departing from the spirit, scope, and teaching of the invention.

What is claimed is:

1. A semiconductor memory device comprising:
a device substrate having a semiconductor layer separated by a dielectric layer from a base substrate;
a memory cell array having a plurality of memory cells formed and arranged on said semiconductor layer of said device substrate, each said memory cell having a MOS transistor structure including diffusion layers formed on said device substrate and a body between the diffusion layers, said body being in an electrically floating state to store data based on a majority carrier accumulation state of said body; and
a sense amplifier circuit configured to read out data of a selected memory cell in said memory cell array to store the read data in a data latch, then transfer the read data to an output circuit and write back the read data into said selected memory cell.

2. The semiconductor memory device according to claim 1, wherein
the read operation of said sense amplifier circuit is to detect cell current of a selected memory cell by applying gate and drain voltages to turn on it, said drain voltage being set higher than a first voltage which is insufficient to cause data destruction even if the data read state is maintained during a period corresponding to a data refresh cycle required for refreshing said memory cell array, and equal to or lower than a second voltage which causes data destruction during a read operation.

3. The semiconductor memory device according to claim 2, wherein
said drain voltage of said selected memory cell is set in a voltage region in which a read time necessary for reading data of said selected memory cell to store in said data latch is not longer than a time length that induces cell data destruction by continuing the data read state.

4. The semiconductor memory device according to claim 1, wherein
a time of a write back operation performed by said sense amplifier circuit for said selected memory cell is shorter than that of an ordinary write operation.

5. The semiconductor memory device according to claim 1, wherein
a time of a write back operation performed by said sense amplifier circuit for said selected memory cell is shorter than that in a data refresh cycle.

6. The semiconductor memory device according to claim 1, further comprising:
a first transfer circuit configured to transfer the read data in said data latch of said sense amplifier to said output circuit; and
a second transfer circuit configured to write back the read data in said data latch into said selected memory cell, said second transfer circuit becoming on simultaneously with said first transfer circuit.

7. The semiconductor memory device according to claim 6, wherein
said second transfer circuit configured to serve for transferring data held in said data latch to said memory cell array in an ordinary write operation and a data refresh operation.

8. The semiconductor memory device according to claim 7, wherein
an on-state period of said second transfer circuit at when the write back is done into said selected memory cell is shorter than that at when said ordinary write operation is done and when data refresh operation is done.

9. The semiconductor memory device according to claim 1, wherein
said sense amplifier circuit further comprises a write back circuit configured to write back data into said selected memory cell only when the read data in said data latch is one in binary data which is disturbed during data read.

10. The semiconductor memory device according to claim 9, wherein
said write back circuit comprises first and second transistors serially connected between a transfer line for transferring write data to said memory cell array and a write back-use power supply line, said first transistor being gate-controlled by one data node of said data latch, said second transistor being gate-controlled by a control signal for writing back.

11. The semiconductor memory device according to claim 1, wherein
said sense amplifier circuit comprises:
an operational amp having a sense node to which a cell data is transferred and a reference node to which a reference voltage is applied;
said data latch connected to an output node of said operational amp for holding read data;
a first current source load connected to said sense node; and
a reference voltage generation circuit configured to have a second current source load connected to said reference node, and generate said reference voltage.

12. The semiconductor memory device according to claim 11, wherein
said reference voltage generation circuit comprises:
first and second reference cells connected to first and second reference bit lines, respectively, into which different reference data are written; and
a switch circuit having first and second transfer gates for commonly connecting said first and second reference bit lines to said reference node during a data read operation, and third and fourth transfer gates for supplying different write-use voltages to said reference bit lines during a data write operation, respectively, and wherein
said second current source load has two times as high drivability as that of said first current source load.

13. The semiconductor memory device according to claim 12, wherein
reference data are written into said first and second reference cells simultaneously with the write back done into said selected memory cell.

14. The semiconductor memory device according to claim 12, further comprising:
first and second power supply lines connected to said first and second reference bit lines through said third and fourth transfer gates to which different reference data write-use voltages are applied, respectively.

15. The semiconductor memory device according to claim 12, further comprising:
first and second data lines connected to said first and second reference bit lines through said third and fourth transfer gates for writing reference data into said first and second reference cells, respectively.

16. The semiconductor memory device according to claim 1, wherein
said sense amplifier further comprises a clamp circuit for clamping a bit line of said memory cell array which is connected to said sense node during a data read operation, and wherein
said reference voltage generation circuit further comprises a dummy clamp circuit for clamping said reference bit lines which are connected to said reference node during said data read operation.

* * * * *